(12) United States Patent
Tham et al.

(10) Patent No.: US 9,054,222 B2
(45) Date of Patent: Jun. 9, 2015

(54) PRESSURE RESISTENTLY ENCAPSULATED, PRESSURE DIFFERENCE SENSOR

(75) Inventors: Anh Tuan Tham, Berlin (DE); Frank Passler, Berlin (DE); Rafael Teipen, Berlin (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 77 days.

(21) Appl. No.: 14/007,704

(22) PCT Filed: Feb. 10, 2012

(86) PCT No.: PCT/EP2012/052313
§ 371 (c)(1),
(2), (4) Date: Sep. 26, 2013

(87) PCT Pub. No.: WO2012/130512
PCT Pub. Date: Oct. 4, 2012

(65) Prior Publication Data
US 2014/0021563 A1      Jan. 23, 2014

(30) Foreign Application Priority Data

Mar. 31, 2011   (DE) .......................... 10 2011 006 517

(51) Int. Cl.
*H01L 29/84*     (2006.01)
*G01L 9/00*      (2006.01)
(Continued)

(52) U.S. Cl.
CPC ............... *H01L 29/84* (2013.01); *H01L 23/473* (2013.01); *G01L 9/0073* (2013.01); *G01L 13/025* (2013.01); *G01L 19/143* (2013.01); *G01L 19/147* (2013.01)

(58) Field of Classification Search
CPC ........................................................ H01L 23/46
USPC .......................................................... 257/420
See application file for complete search history.

(56) References Cited

U.S. PATENT DOCUMENTS

| 4,670,733 A | 6/1987 | Bell |
| 4,833,920 A | 5/1989 | Knecht |

(Continued)

FOREIGN PATENT DOCUMENTS

| CN | 1469995 A | 1/2004 |
| CN | 101241031 A | 8/2008 |

(Continued)

OTHER PUBLICATIONS

International Search Report, EPO, The Netherlands, Apr. 5, 2012.
(Continued)

*Primary Examiner* — Chandra Chaudhari
(74) *Attorney, Agent, or Firm* — Bacon & Thomas, PLLC

(57) ABSTRACT

A pressure difference sensor includes a capsule, which has a ceramic capsule body. The capsule has a transducer seat in its interior, wherein there is arranged in the transducer seat a semiconductor pressure measuring transducer core, which has a measuring membrane body and at least one support body. The measuring membrane body is connected pressure-tightly with the at least one support body, which has a pressure inlet opening. Ducts extend respectively from an outer surface of the capsule into the transducer seat, wherein the pressure inlet opening communicates with the first duct A side of the measuring membrane is contactable with a pressure through the pressure inlet opening, wherein the support body contacts a joint, which surrounds the first pressure inlet opening and the opening of the first duct into the transducer seat and is connected pressure-tightly with a wall of the transducer seat, and wherein a second side of the measuring membrane is hydraulically isolated from its first side and communicates with the second duct.

15 Claims, 2 Drawing Sheets

(51) Int. Cl.
*G01L 13/02* (2006.01)
*G01L 19/14* (2006.01)
*H01L 23/473* (2006.01)

(56) References Cited

U.S. PATENT DOCUMENTS

| | | |
|---|---|---|
| 5,134,887 A | 8/1992 | Bell |
| 5,157,972 A | 10/1992 | Broden |
| 5,587,601 A * | 12/1996 | Kurtz ............................. 257/420 |
| 7,075,160 B2 * | 7/2006 | Partridge et al. .............. 257/417 |
| 8,402,836 B2 | 3/2013 | Dannhauer |
| 2002/0108447 A1 | 8/2002 | Burczyk |
| 2002/0194920 A1 | 12/2002 | Scholz |
| 2012/0017690 A1 | 1/2012 | Philipps |

FOREIGN PATENT DOCUMENTS

| | | |
|---|---|---|
| CN | 101479586 A | 7/2009 |
| DE | 3751546 T2 | 2/1996 |
| DE | 69214940 T2 | 5/1997 |
| DE | 102007061184 A1 | 6/2009 |
| JP | 58031854 A | 2/1983 |
| WO | 2008089969 A2 | 7/2008 |
| WO | 2010108949 A1 | 9/2010 |

OTHER PUBLICATIONS

German Search Report, German PTO, Munich, Jan. 20, 2012.
English translation of International Preliminary Examination Report in corresponding International Application No. PCT/EP2012/052313, dated Oct. 10, 2013.

* cited by examiner

PRESSURE RESISTENTLY ENCAPSULATED, PRESSURE DIFFERENCE SENSOR

TECHNICAL FIELD

The present invention relates to a pressure difference sensor, especially a pressure difference sensor with a transducer core of a semiconductor material or a ceramic material.

BACKGROUND DISCUSSION

Such pressure difference sensors are known, wherein the transducer cores comprise especially piezoresistive or capacitive transducers, in order to transduce a pressure difference dependent deflection of a measuring membrane of the transducer core into an electrical signal. Such transducer cores are usually installed in a measuring apparatus comprised of a metal material, especially steel. This brings about considerable problems as regards the construction- and joining technology, since the coefficient of thermal expansion of silicon, an established material for semiconductor pressure measuring transducers, amounts to about 3×10-6/K, while the coefficient of thermal expansion for the here relevant stainless steels lies between 10 and 16×10-6/K. In order to accommodate this situation, the transducer core is frequently firstly mounted on a decoupling body, which is then secured, for example, by adhesive or soldering, to a surface containing steel. A corresponding construction with a semiconductor socket is disclosed, for example, in German Offenlegungsschrift 10 2007 053 859 A1. Offenlegungsschrift DE 10 2006 057 828 A1 discloses a pressure difference transducer, in the case of which a transducer core includes a piezoresistive silicon chip on a measuring membrane support, wherein the measuring membrane support is secured on the surface of a glass body. The direct securement of a silicon chip on a glass support is suitable for relative pressure sensors, but, for pressure difference sensors, it is problematic, since glasses have, as a rule, a smaller compression modulus than silicon. This leads to cross sensitivities relative to the static pressure, as described in Offenlegungsschrift DE 10 2006 062 222 A1. The publication DE 11 2004 000 818 T5 discloses, finally, a pressure sensor capsule, in the case of which a semiconductor absolute pressure sensor is surrounded isostatically by a pressure transfer liquid in a metal housing, wherein the semiconductor body of the pressure sensor is secured pressure-tightly at a passageway in the metal wall of the pressure sensor capsule via a load isolation element, which comprises a ceramic material, and which, relative to the semiconductor pressure sensor, has a small cross sectional area. Although this approach to a solution can function for an absolute pressure sensor, it is completely unsuitable for a pressure difference sensor, because a pressure difference sensor basically requires two pressure supply lines to a transducer core, which are sealed relative to one another.

The as yet unpublished German patent application No. 10 2010 043043 discloses a difference measuring transducer, in the case of which a semiconductor transducer core is seated softly in a housing between elastic supports. This approach is certainly very interesting, but it has, however, limits as regards loadability with static pressures, or differences between static pressures. Additionally, the soft seating of the silicon chip requires a minimum volume, in order that the decoupling effect of the elastic seals, respectively seating, between the silicon chip and the metal housing can be effective.

SUMMARY OF THE INVENTION

It is, consequently, an object of the present invention to provide a pressure difference transducer, which overcomes the disadvantages of the state of the art.

The object is achieved according to the invention by the difference pressure meter which includes a capsule, which has a ceramic capsule body, wherein the capsule has a transducer seat in its interior, wherein there is arranged in the transducer seat a semiconductor pressure measuring transducer, which has a measuring membrane body and at least one support body, wherein the measuring membrane body is connected along a peripheral edge pressure-tightly with the at least one support body, wherein the support body has at least one pressure inlet opening, wherein a first duct and a second duct extend from an outer surface of the capsule into the transducer seat; wherein the pressure inlet opening communicates with the first duct, wherein a first side of the measuring membrane, which faces the at least one support body, is contactable through the at least one pressure inlet opening with a pressure introduced through the first duct, wherein the at least one support body contacts a pressure-bearing joint, which surrounds the first pressure inlet opening pressure-tightly, surrounds the opening of the first duct into the transducer seat, and is connected pressure-tightly with a wall of the transducer seat, and wherein a second side of the measuring membrane, which faces away from the first side of the measuring membrane, is hydraulically isolated from the first side of the measuring membrane and communicates with the second duct.

In a further development of the invention, the support body of the semiconductor pressure measuring transducer core has a first effective coefficient of thermal expansion $\alpha_1$, wherein the ceramic material of the capsule body has a second coefficient of thermal expansion $\alpha_2$, wherein $|(\alpha_1-\alpha_2)/(\alpha_1+\alpha_2)|<0.25$ especially <0.2, preferably <0.15.

In a further development of the invention, the at least one, first joint between the transducer core and a wall of the transducer seat comprises glass.

In a further development of the invention, the joint has a thickness of no more than 100 µm, especially no more than 75 µm and preferably no more than 50 µm.

In a further development of the invention, the capsule body has a first body portion and a second body portion, wherein the first body portion and the second body portion are joined with one another pressure-tightly along a second joint.

In a further development of the invention, the second joint comprises glass.

In a further development of the invention, the first body portion and the second body portion are essentially symmetrical to one another.

In a further development of the invention, the transducer core includes a second support body, wherein the measuring membrane body is arranged between the first and second support bodies and connected pressure-tightly with both support bodies.

In an embodiment of this further development of the invention, the second support body is connected with a third joint Pressure-tightly with a wall of the transducer seat.

In a further development of the invention, the transducer core is constructed essentially symmetrically and symmetrically arranged in the transducer chamber.

In a further development of the invention, the third joint has an opening, which is aligned with the second duct, wherein the second support body has a pressure inlet opening, which communicates with a second side of the measuring membrane, wherein the pressure inlet opening is arranged aligned with the second duct, in order to supply the second side of the measuring membrane with a pressure introduced through the second duct.

In a further development of the invention, the transducer seat has electrical contact points, via which the transducer core is contacted in flip-chip technology, wherein the contact points are led via electrical leads to electrical connections on an outer surface of the pressure capsule.

In a further development of the invention, the first body portion and the second body portion have in the region of the first, respectively third, joint a first ceramic material, to whose coefficient of thermal expansion the effective coefficient of thermal expansion of the transducer core is matched, and wherein the first and the second body portions have in a region facing away from the first, respectively third, joint, in each case, a second ceramic material, whose coefficient of thermal expansion is matched to the coefficient of thermal expansion of a metal material, wherein the first duct and the second duct, in each case, terminate in a region of an outer surface of the first, respectively second, body portion, which is comprised of the second ceramic material, wherein the first and second ducts communicate, respectively, with first and second capillary lines, which are comprised of the metal material, and which are connected pressure-tightly with the capsule, in order to introduce a first, respectively second, pressure into the transducer seat.

In a further development of the invention, the transducer seat forms a pressure tight transducer chamber, in which the transducer core is arranged.

In a further development of the invention, the second duct communicates with the volume in the transducer chamber outside of the transducer core, in order to supply the transducer core isostatically on its outer surfaces with the pressure introduced via the second duct.

BRIEF DESCRIPTION OF THE DRAWINGS

The invention will now be explained based on the examples of embodiments presented in the drawing, the figures of which show as follows.

DETAILED DISCUSSION IN CONJUNCTION WITH THE DRAWINGS

Figure 1:
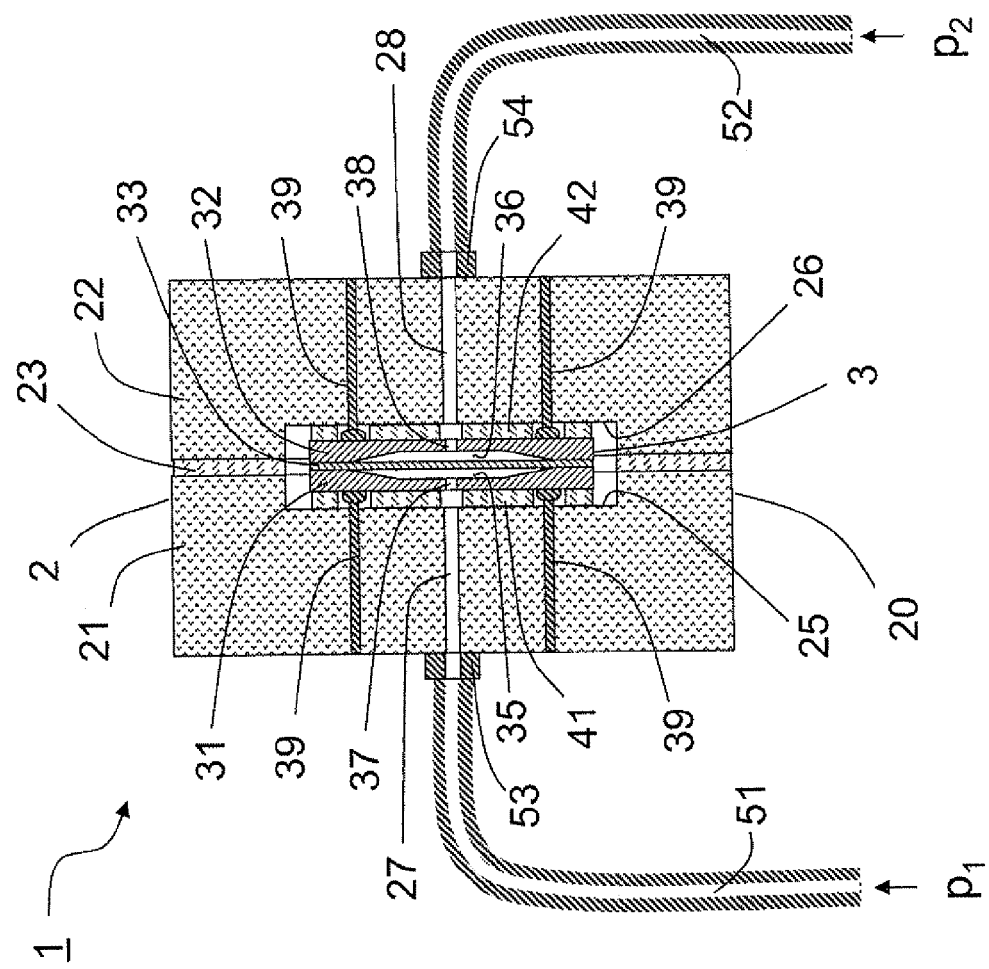
FIG. 1 is a longitudinal section through a first example of an embodiment of a pressure difference measuring transducer of the invention.

The pressure difference sensor 1 shown in FIG. 1 includes a capsule 2, in which a semiconductor pressure measuring transducer core 3 is arranged. Capsule 2 includes a ceramic capsule body 20, which is formed of two ceramic body portions 21, 22, which are connected with one another along a joint 23, especially a joint 23 comprised of a glass solder. The semiconductor pressure measuring transducer core 3 includes a first support body 31, a second support body 32 and a measuring membrane body 33, which is secured pressure-tightly to both support bodies. Each of the support bodies 31, 32 has, on its side facing the measuring membrane a cavity 35, respectively 36, wherein the surfaces of the support bodies 31 and 32, which delimit the cavities 35 and 36, can serve especially as membrane beds, against which the measuring membrane 33 can lie in the case of overload. Each of the first and second support bodies 31, 32 has a bore 37, respectively 38, through which the measuring membrane 33 is contactable with pressures $p_1$, respectively $p_2$, wherein the measuring membrane 33 experiences a deflection, which depends on the pressure difference $p_1-p_2$. In the present example of an embodiment, the semiconductor pressure measuring transducer core is a capacitive pressure measuring transducer, wherein the first support body and the second support body each have at least one counter electrode, and wherein the capacitance between each counter electrode and the measuring membrane enters into determining the pressure difference $p_1-p_2$.

The support bodies 31, 32 and the measuring membrane 33 comprise especially silicon, wherein the measuring membrane is preferably highly doped silicon, and wherein the counter electrodes are likewise prepared by doping or via metal coatings. For bringing away the electrical signals of the semiconductor pressure measuring transducer core 3, electrical leads 39 are provided extending through the capsule body 2, wherein the electrical leads 39 contact the semiconductor pressure measuring transducer core on base surfaces of the support bodies 31, 32, especially by means of flip-chip technology. The semiconductor pressure measuring transducer core 3 is supported in the transducer chamber formed by the cavities 25, 26 in the interior of the capsule body 2 on both body portions of the capsule body with respective pressure-bearing joints 41, 42, wherein the joints especially comprise glass. Extending through the first and second body portions and through the joints between the semiconductor pressure measuring transducer core 3 and the body portions 21, 22 are respective ducts 27, 28, which align with the respective pressure inlet openings 37, 38 in the membrane support bodies, so that the semiconductor pressure, measuring transducer core 3 is contactable through the ducts 27, 28 with first and second pressures, in order to determine their difference. The materials of the body portions, the joints between the body portions and the joints between the semiconductors and the semiconductor pressure measuring transducer core as well as the thicknesses of the joints, and the depths of the cavities 25, 26 in the end faces of the body portions 21, 22 are matched in such a way to the dimensions of the semiconductor pressure measuring transducer core 3 that mechanical stresses due to temperature fluctuations do not lead to damaging of the semiconductor pressure measuring transducer core or to corruption of measured values, in spite of the different coefficients of thermal expansion the involved materials. Suitable as material for the capsule body are especially cordierite, mullite, silicon carbide, silicon nitride and aluminum nitride. Especially suitable for the joints is glass solder. The cavities in the semiconductor pressure measuring transducer core 35, 36 can be prepared with usual semiconductor processing methods, especially anisotropic etching, photolithographic methods or laser ablation. In order to supply the semiconductor pressure measuring transducer core 1 with the first pressure $p_1$ and the second pressure $p_2$, for example, metal capillary lines 51, 52 can be secured to the capsule body 2 at the ducts 27, 28 by means of a hard solder, or braze, joint 53, 54.

Figure 2:
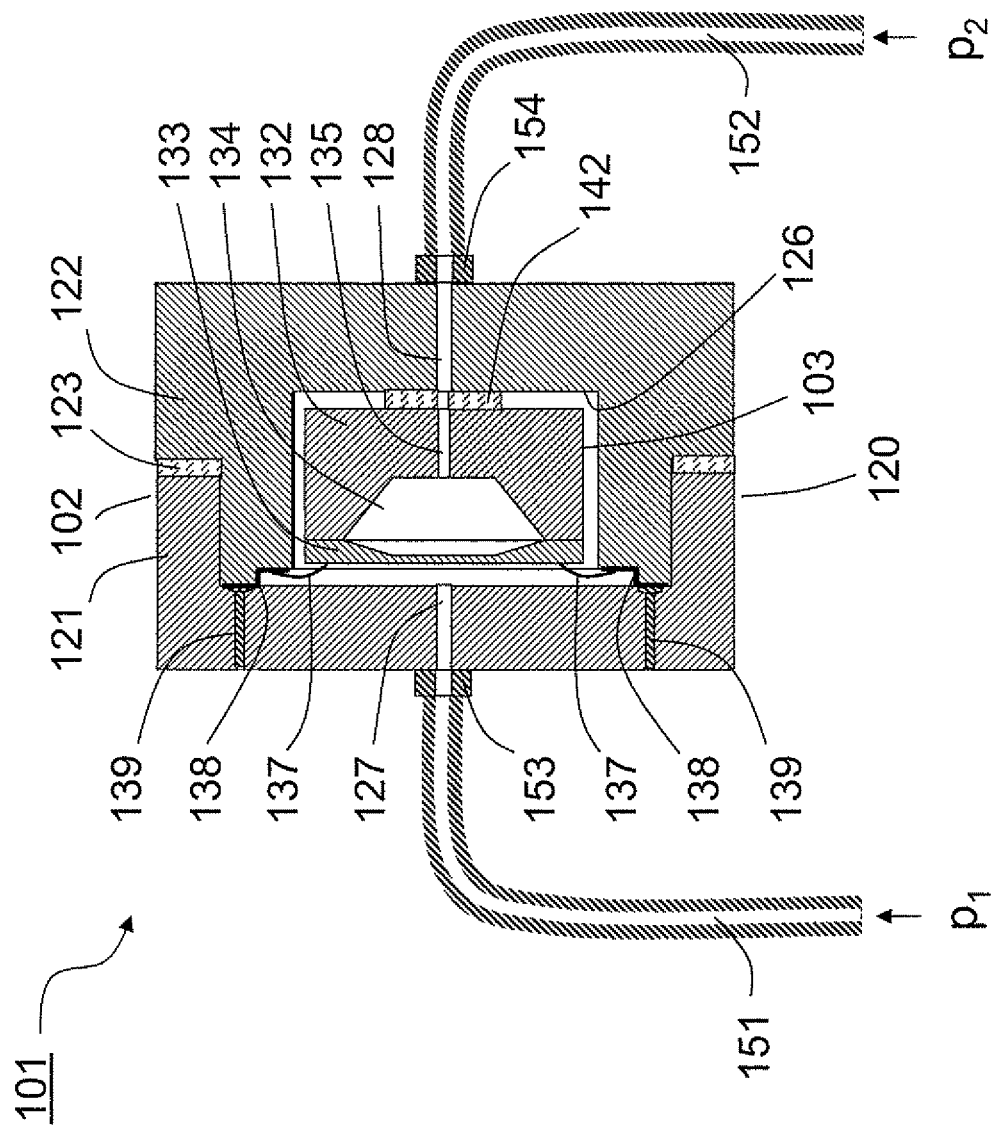
FIG. 2 is a longitudinal section through a second example of an embodiment of a pressure difference measuring transducer of the invention.

The pressure difference sensor 101 shown in FIG. 2 includes a capsule 102, in which a semiconductor pressure measuring transducer core 103 is arranged. Capsule 102 includes a ceramic capsule body 120, which is formed of two ceramic body portions 121, 122, which are connected pressure-tightly with one another along a joint 123, especially a joint 123 of glass solder.

The semiconductor pressure measuring transducer core 103 is arranged in a transducer chamber formed by a cavity 126 in the second body portion 122 in the interior of the capsule body 120 and secured to the second body portion 122 of the capsule body with a pressure-bearing joint 142, wherein the joint comprises especially glass solder. Extending through the first and second body portions 121, 122 are respective ducts 127, 128, in order to introduce into the transducer chamber the two pressures, whose difference is to be ascertained. The joint 142 between the semiconductor pressure measuring transducer core 103 and the second body portion 122 surrounds a passageway to the semiconductor pressure measuring transducer core, wherein the passageway is aligned with the duct 128 through the second body portion 122.

Semiconductor pressure measuring transducer core 103 includes a support body 132 and a measuring membrane body 133, which is secured pressure-tightly on the support body, wherein the joint 142 between the semiconductor pressure measuring transducer core and the second body portion 122 is formed between the support body 132 and the second body portion. Support body 132 includes optionally in its measuring membrane facing end a cavity 134, which contributes to the symmetrization of the volumes in the capsule on both sides of the measuring membrane 133. Support body 132 includes a bore 135, through which the measuring membrane 133 is contactable with a pressure $p_2$. Bore 135 aligns with the passageway through the joint 142 and with the duct 128 through the second body portion.

On its outer side facing away from the support body 132, the measuring membrane 133 is contactable with a pressure $p_1$, which is introducible through the duct 127, which extends through the first body portion 121, into the measuring cell, wherein this pressure $p_1$ acts not only on the outer side of the measuring membrane 133, but, instead, also on the outer surfaces of the support body 132 to the outside of the joint 142, so that the semiconductor pressure measuring transducer core 103 is largely isostatically seated. The mechanical load of the semiconductor pressure measuring transducer core is then, apart from the compression of the materials due to the static pressure, given by the difference between the two pressures $p_1-p_2$. To the extent that it is foreseeable which of the considered pressures will be larger, it is currently preferred that the larger pressure be led as $p_1$ to the outer side of the semiconductor pressure measuring transducer core 103.

In the present example of an embodiment, the semiconductor pressure measuring transducer core 103 is embodied as a piezoresistive pressure measuring transducer core, wherein the measuring membrane 133 has doped measuring resistors, especially such in the form of a full bridge circuit. Both the measuring membrane 133 and also the support body 132 comprise silicon in a currently preferred embodiment of the invention.

For bringing away the electrical signals of the semiconductor pressure measuring transducer core 103, electrical leads 139 are provided through the capsule body 102, wherein the electrical leads 139 do not directly contact the semiconductor pressure measuring transducer core 103 in this embodiment. Instead, bond-wires 137 lead from contact surfaces on the edge of the measuring membrane 133 to metal, conductive traces 138, which are formed on an end face of the second body portion 122. These conductive traces are contacted by the electrical leads 139, which extend through the first body portion 121.

Suitable as material for the body portions 121, 122 of the capsule body 102 are especially cordierite, mullite, silicon carbide, silicon nitride and aluminum nitride. The joints especially comprise glass solder.

In order to supply the semiconductor pressure measuring transducer core 101 with the first pressure $p_1$ and the second pressure $p_2$, for example, metal capillary lines 151, 152 can be secured to the capsule body 102 at the ducts 127, 128 by means of a hard solder, or braze, joint 153, 154.

The invention claimed is:

1. A pressure difference sensor, comprising:
   a capsule, which has a ceramic capsule body, said capsule has a transducer seat in its interior,
   a semiconductor pressure measuring transducer core arranged in said transducer seat, which has a measuring membrane body and at least one support body, said measuring membrane body is connected along a peripheral edge pressure-tightly with said at least one support body, said support body has at least one pressure inlet opening; and
   a first duct and a second duct extend from an outer surface of said capsule into said transducer seat, wherein:
   said pressure inlet opening communicates with the first duct;
   a first side of said measuring membrane, which faces said at least one support body, is contactable through said at least one pressure inlet opening with a pressure introduced through said first duct;
   said at least one support body contacts a pressure-bearing joint, which surrounds said first pressure inlet opening pressure-tightly, surrounds the opening of said first duct into said transducer seat, and is connected pressure-tightly with a wall of said transducer seat; and
   a second side of said measuring membrane, which faces away from said first side of said measuring membrane, is hydraulically isolated from said first side of said measuring membrane and communicates with said second duct.

2. The pressure difference sensor as claimed in claim 1, wherein:
   said support body of said semiconductor pressure measuring transducer core has a first effective coefficient of thermal expansion $\alpha_1$; and
   the ceramic material of said capsule body has a second coefficient of thermal expansion $\alpha_2$, wherein $|(\alpha_1-\alpha_2)/(\alpha_1+\alpha_2)|<0.25$ especially $<0.2$, preferably $<0.15$.

3. The pressure difference sensor as claimed in claim 1, wherein:
   said at least one, first joint between the transducer core and a wall of said transducer seat comprises glass.

4. The pressure difference sensor as claimed in claim 3, wherein:
   the joint has a thickness of no more than 100 μm, especially no more than 75 μm and preferably no more than 50 μm has.

5. The pressure difference sensor as claimed in claim 1, wherein:
   said capsule body has a first body portion and a second body portion; and
   said first body portion and said second body portion are joined pressure-tightly with one another along a second joint.

6. The pressure difference sensor as claimed in claim 5, wherein:
   said second joint comprises glass.

7. The pressure difference sensor as claimed in claim 6, wherein:
   said first body portion and said second body portion are essentially symmetrical to one another.

8. The pressure difference sensor as claimed in claim 1, wherein:
   said transducer core includes a second support body; and said measuring membrane body is arranged between said first and said second support bodies and connected pressure-tightly with both support bodies.

9. The pressure difference sensor as claimed in claim 8, wherein:
said second support body is connected with a third joint pressure-tightly with a wall of said transducer seat.

10. The pressure difference sensor as claimed in claim 1, wherein:
said transducer core is constructed essentially symmetrically and symmetrically arranged in said transducer chamber.

11. The pressure difference sensor as claimed in claim 9, wherein:
said third joint has an opening, which is aligned with said second duct;
said second support body has a pressure inlet opening, which communicates with a second side of said measuring membrane; and
said pressure inlet opening is arranged aligned with said second duct, in order to supply said second side of said measuring membrane with a pressure introduced through said second duct.

12. The pressure difference sensor as claimed in claim 1, wherein:
said transducer seat has electrical contact points, via which said transducer core is contacted in flip-chip technology; and
said contact points are led via electrical leads to electrical connections on an outer surface of said pressure capsule.

13. The pressure difference sensor as claimed in claim 5, wherein:
said first body portion and said second body portion have in the region of said first, respectively third, joint a first ceramic material, to whose coefficient of thermal expansion the effective coefficient of thermal expansion of said transducer core is matched; and
said first and said second body portions have in a region facing away from said first, respectively third, joint, in each case, a second ceramic material, whose coefficient of thermal expansion is matched to the coefficient of thermal expansion of a metal material;
said first duct and said second duct, in each case, terminate in a region of an outer surface of said first, respectively second, body portion, which is comprised of said second ceramic material; and
said first and said second ducts communicate, in each case, with first and second capillary lines, which are comprised of the metal material, and which are connected pressure-tightly with said capsule, in order to introduce a first, respectively second, pressure into the transducer seat.

14. The pressure difference sensor as claimed in claim 1, wherein:
said transducer seat forms a pressure tight transducer chamber, in which said transducer core is arranged.

15. The pressure difference sensor as claimed in claim 14, wherein:
said second duct communicates with the volume in said transducer chamber outside of said transducer core, in order to supply said transducer core isostatically on its outer surfaces with the pressure introduced via said second duct.

* * * * *